United States Patent
Li

(10) Patent No.: US 8,253,447 B2
(45) Date of Patent: Aug. 28, 2012

(54) APPARATUS AND METHOD FOR FREQUENCY CONVERSION AND FILTER THEREOF

(75) Inventor: Liang-Hui Li, Tainan (TW)

(73) Assignee: Realtek Semiconductor Corp, Hsinchu (TW)

( * ) Notice: Subject to any disclaimer, the term of this patent is extended or adjusted under 35 U.S.C. 154(b) by 78 days.

(21) Appl. No.: 12/718,125

(22) Filed: Mar. 5, 2010

(65) Prior Publication Data

US 2010/0225360 A1 Sep. 9, 2010

(30) Foreign Application Priority Data

Mar. 5, 2009 (TW) ................................ 98107153 A

(51) Int. Cl.
H03B 19/00 (2006.01)

(52) U.S. Cl. .......... 327/113; 327/94; 327/114; 327/116; 455/326

(58) Field of Classification Search ............... 327/94, 327/113, 114, 116; 455/326
See application file for complete search history.

(56) References Cited

U.S. PATENT DOCUMENTS 7,254,598 B2 * 8/2007 Yomo et al. ............... 708/319

* cited by examiner

*Primary Examiner* — John Poos
(74) *Attorney, Agent, or Firm* — Birch, Stewart, Kolasch & Birch, LLP

(57) ABSTRACT

The present invention relates to an apparatus for frequency conversion, comprising: an analog-to-digital (A/D) converter, receiving and sampling an input signal according to a sampling frequency for producing a first digital signal, and the sampling frequency and the frequency of the input signal having a correspondence; a sign conversion circuit, used for receiving the first digital signal, and performing a sign conversion on the first digital signal and producing a second digital signal; a first switching module, used for selecting one of the first digital signal and the second digital signal as an output signal according to the sampling frequency; a filter, coupled to the first switching module, used for filtering the output signal from the first switching module, and producing a filter signal; and a second switching module, coupled to the filter, used for outputting the filter signal to a first output path or a second output path alternately according to the sampling frequency. Thereby, according to the present invention, by means of the correspondence between the sampling frequency and the frequency of the input signal, the use of a filter and an A/D converter can be saved, and thus reducing circuit area and cost.

14 Claims, 5 Drawing Sheets

APPARATUS AND METHOD FOR FREQUENCY CONVERSION AND FILTER THEREOF

FIELD OF THE INVENTION

The present invention relates to an apparatus and a method for conversion, and particularly to an apparatus and a method for frequency conversion.

BACKGROUND OF THE INVENTION

For wireless communication products, the major components generally include transmitter and receiver. The innovation of the present invention focuses on receiver. For modern TV systems, the architecture of a tuner is divided into two types. One is the architecture with intermediate-frequency (IF) output signal applied in the conventional CAN tuner; the other is the zero-IF architecture widely used in the silicon tuner. Thereby, the apparatus for frequency conversion in the demodulation circuit of the tuner backend has to support both of the input signal types, namely, the IF input signal and the baseband input signal. FIG. 1 shows a block diagram of an apparatus for frequency conversion with IF input signal according to the prior art. As shown in the figure, the apparatus for frequency conversion 10' according to the prior art comprises an analog-to-digital (A/D) converter 12', a first multiplier 14' a second multiplier 16', an oscillator 18', a first filer 24', and a second filter 26'. The A/D converter 12' receives the IF signal output by the tuner 1', and converts the IF signal according to a sampling frequency $f_s$ to produce a digital signal and transmit it to the first and second multipliers 14', 16'. The first and second multipliers 14', 16' multiply the digital signal by a cosine and a sine signal, respectively, to down-convert the IF signal to a baseband signal, which is transmitted to the first and second filters 24', 26' to produce I and Q signals for subsequent circuits.

Because the demodulation circuit has to support both of the IF and baseband signals output by the tuner 1', the demodulation circuit needs to adopt either the apparatus for frequency conversion 10' in FIG. 1 or a frequency converter capable of receiving a baseband signal. No matter which type of the apparatus for frequency conversion is adopted, two filters are needed, which occupies the area of the demodulation circuit and increases the cost.

SUMMARY

An objective of the present invention is to provide an apparatus and a method for frequency conversion, which reduce the use of filers, and thus reducing circuit area and cost.

Another objective of the present invention is to provide an apparatus and a method for frequency conversion, which reduce the use of analog-to-digital converters, and thus reducing circuit complexity, area, and cost.

Still another objective of the present invention is to provide an apparatus and a method for frequency conversion, which eliminate the use of mixers, and thus reducing circuit complexity, area, and cost.

A further objective of the present invention is to provide an apparatus and a method for frequency conversion, which can support both the intermediate-frequency signal and the baseband signal output by a tuner, and thus reducing circuit area and cost, and improving performance.

The apparatus for frequency conversion according to the present invention comprises an analog-to-digital (A/D) converter, a sign conversion circuit, a first switching module, a filter, and a second switching module. The A/D converter samples an input signal according to a sampling frequency, and produces a first digital signal. There exists a correspondence between the sampling frequency and the frequency of the input signal. The sign conversion circuit receives the first digital signal, and performs a sign conversion to the first digital signal to produces a second digital signal. The first switching module is used for selecting one of the first and second digital signals as an output signal according to the sampling frequency. The filter receives and filters the output signal to produce a filter signal. The second switching module is used for outputting the output signal to a first output path and a second output path alternately according to the sampling frequency. Thereby, the use of filters and A/D converters can be reduced by one, respectively. Hence, the circuit area and cost can be reduced.

Besides, the apparatus for frequency conversion according to the present invention further comprises a third switching module and a switching control module. The third switching module is coupled to the A/D converter, and switches between a first input path and a second input path according to the sampling frequency and a switching control signal for receiving the input signal, and transmitting the input signal received via the first or second input path to the A/D converter. The third switching module can also stop switching according to the switching control signal, and transmits the signal received via the first input path. The switching control module is used for producing the switching control signal for the first and third switching modules, for controlling switching of the first and third switching modules. Thereby, the apparatus for frequency conversion according to the present invention can support both the intermediate-frequency signal and baseband signal output by a tuner, and thus reducing circuit area and cost, and improving performance.

DETAILED DESCRIPTION

In order to make the structure and characteristics as well as the effectiveness of the present invention to be further understood and recognized, the detailed description of the present invention is provided as follows along with preferred embodiments and accompanying figures.

Figure 2:
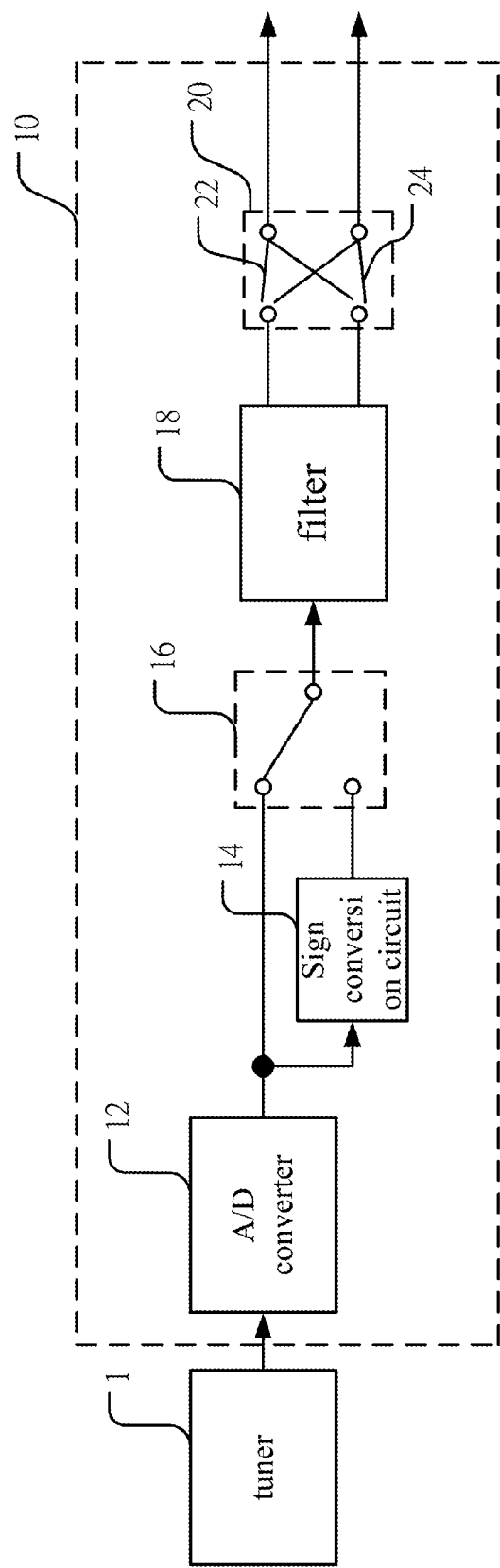
FIG. 2 shows a block diagram according to a preferred embodiment of the present invention.

FIG. 2 shows a block diagram according to a preferred embodiment of the present invention. As shown in the figure, the apparatus for frequency conversion 10 according to the present invention comprises an analog-to-digital (A/D) converter 12, a sign conversion circuit 14, a switch 16, a filter 18, and a switching module 20. The A/D converter 12 receives an input signal, and samples the input signal according to a sampling frequency $f_s$ of a sampling signal for producing a first digital signal. The input signal is an output signal of a tuner 1. The input signal thereof can be an intermediate-frequency (IF) signal. The A/D converter 12 outputs the first digital signal to the switch 16 and the sign conversion circuit 14. The sign conversion circuit 14 receives the first digital signal, and performs a sign conversion to the first digital signal for producing a second digital signal. According to a first preferred embodiment, the sign conversion circuit 14 performs sign inversion; according to a second preferred embodiment, the sign conversion circuit 14 can be a 1's complement circuit; according to a third preferred embodiment, the sign conversion circuit 14 can be a 2's complement circuit. In addition, the sign conversion circuit 14 can also be a multiplier, used for multiplying a negative number to the first digital signal for producing the second digital signal.

The switch 16 switches at a switching frequency according to the frequency of half the sampling frequency ($f_s/2$) for selecting one of the first or second digital signals as an output signal. Namely, one of the first or second digital signals is transmitted to the filter 18, such as a low-pass filter, for filtering and producing a first filter signal and a second filter signal. The switching module 20 is coupled to the filter 18, and is used for outputting the filter signal to a first output path and a second output path alternately according to the sampling frequency. That is, the switching module 20 switches according to the sampling frequency $f_s$ for outputting the first and second filter signal as an output signal of the apparatus for frequency conversion 10. The first output path and the second output path are an inphase (I) output path and a quadrature (Q) output path, respectively. The switching module 20 includes a first switch 22 and a second switch 24. The first switch 22 is used for switching the first or the second filter signal from the filter 18 as the I signal; the second switch 24 is used for switching the first or the second filter signal from the filter 18 as the Q signal.

Figure 1:
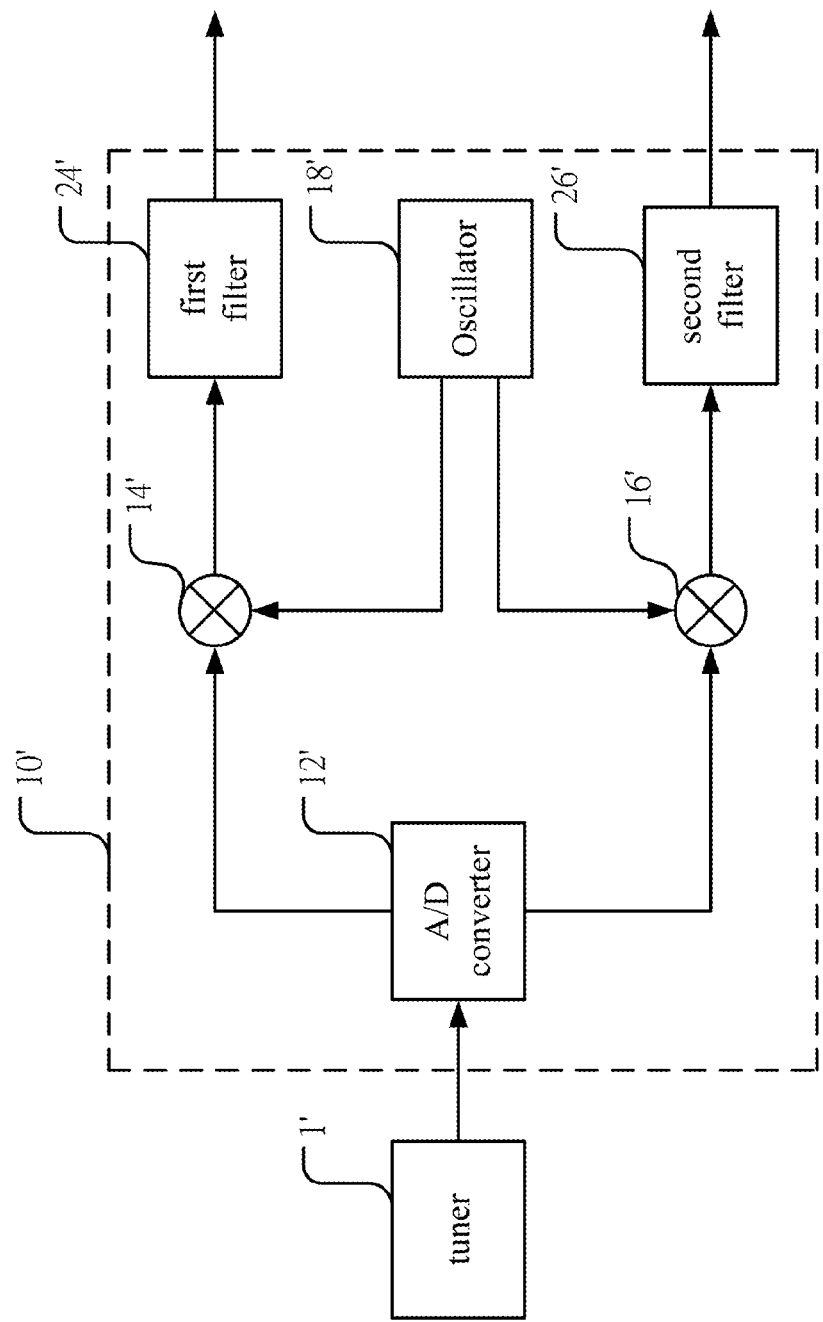
FIG. 1 shows a block diagram of an apparatus for frequency conversion with IF input signal according to the prior art.

The sampling frequency $f_s$ of the A/D converter 12 needs to comply with the following equation:

$$n*\text{Sampling Frequency}(f_s) \pm \text{Intermediate Frequency}(f_{IF}) = \text{Sampling Frequency}(f_s)/4$$

where n is an arbitrary integer. If n=−1, then the sampling frequency $f_s = (4/5)*f_{IF}$·n can be selected according to the standard of the A/D converter 12 and the amount of data needed by subsequent circuits (not shown in the figure). Thereby, the sampling frequency $f_s$ of the A/D converter 12 is given. According to a preferred embodiment, −1, 0, and 1 are adopted for n. According to an embodiment, the frequency of the selected input signal is equal to one quarter of the sampling frequency of the sampling signal. Namely, the frequency of the digital IF is $f_{DIF} = f_s/4$. Thereby, the cosine and sine sequences produced by the oscillator 18' (as shown in FIG. 1) can be simplified to 0, 1, 0, −1 . . . sequence. Consequently, the multipliers 14', 16' in FIG. 1 according to the prior art can be omitted, and the filter 18 can be used to replace the first and second filters 24', 26' in FIG. 1 according to the prior. Thereby, the circuit area and cost can thus be saved. In addition, because the sequence (0, 1, 0, −1 . . . ) and the sequence (1, 0, −1, 0 . . . ) represent sine and cosine sequences, respectively, the two sequences can be combined to a single sequence (1, 1, −1, −1 . . . ). Hence, the first switch 16 switches at a switching frequency according to one half of the sampling frequency ($f_s/2$) for giving the first or the second digital signal, and transmitting it to the filter 18 for filtering I and Q signals simultaneously. The embodiment described above needs only one multiplier and one filter, relatively saving cost.

According to an embodiment, the filter 18 can be a finite impulse response (FIR) filter for filtering the first or second digital signals. Besides, because the filter 18 is symmetric, the filter can be an FIR filter with symmetric coefficients.

Figure 3:
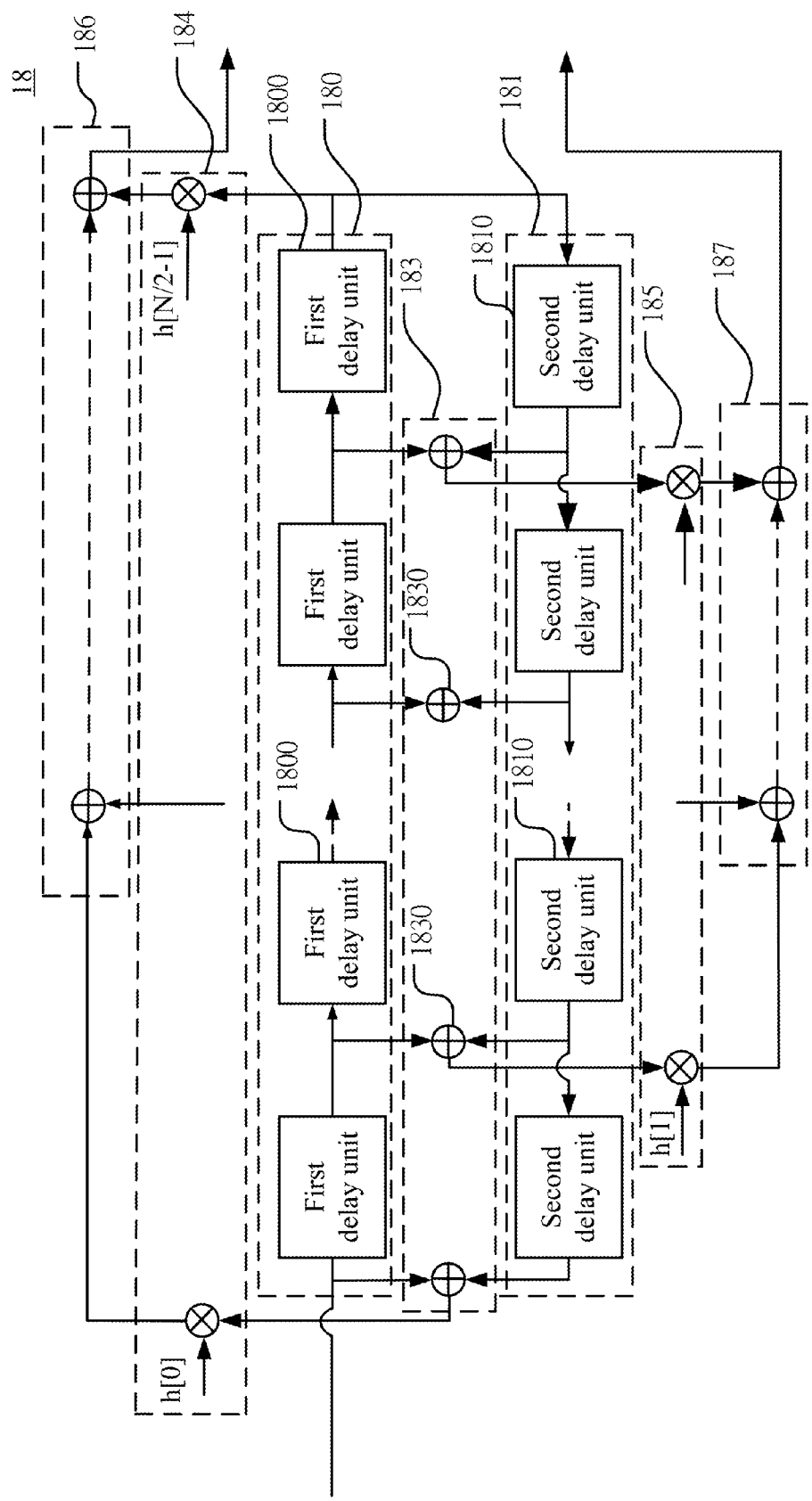
FIG. 3 shows a block diagram of a finite impulse response filter according to a preferred embodiment of the present invention.

FIG. 3 shows a block diagram of a finite impulse response filter according to a preferred embodiment of the present invention. As shown in the figure, the filter 18 according to the present invention comprises a first delay module 180, a second delay module 181, a first adder module 183, a first multiplier module 184, a second multiplier module 185, a second adder module 186, and a third adder module 187. The first delay module 180, the second delay module 181, and the first adder module 183 include a plurality of first delay units 1800, a plurality of second delay units 1810, and a plurality of third adder units 1830, respectively.

The first delay module 180 delays the first or second digital signal sequentially. The second delay module 181 delays the plurality of first delay signals coming from the first delay units 1800, and produces a plurality of second delay signals sequentially. The first adder module 183 corresponds to the plurality of first delay signals and the plurality of second delay signals, respectively. The plurality of adder units 1830 adds the corresponding first and second delay signal, and produces a plurality of first sum signals sequentially. The plurality of first delay units 1800 is connected in series for delaying the first or second digital signal, and producing the plurality of first delay signals. The plurality of second delay units 1810 is connected in series for delaying the first delay signal output by the last first delay unit 1800 in the plurality of first delay units 1800 connected in series, and producing the plurality of second delay signals. The plurality of first adder units 1830 corresponds to the plurality of first delay units 1800 and the plurality of second delay units 1810, respectively, and adds the first and second delay signals corresponding to the first and second delay units 1800, 1810, respectively.

The first multiplier module 184 multiplies the odd-th first sum signal in the plurality of first sum signals by a corresponding first coefficient in a plurality of first coefficients, respectively, and produces a plurality of first product signals. The second multiplier module 185 multiplies the even-th first sum signal in the plurality of first sum signals by a corresponding second coefficient in a plurality of second coefficients, respectively, and produces a plurality of second product signals. The second adder module 186 adds the plurality of first product signals, and produces the first filter signal. The third adder module 187 adds the plurality of second product signals, and produces the second filter signal. Thereby, the filter 18 according to the present invention shares the first adder module 183 by means of the first and second delay modules 180, 181 and reduces the computation by half. Hence, the circuit area and cost is reduced.

Figure 4:
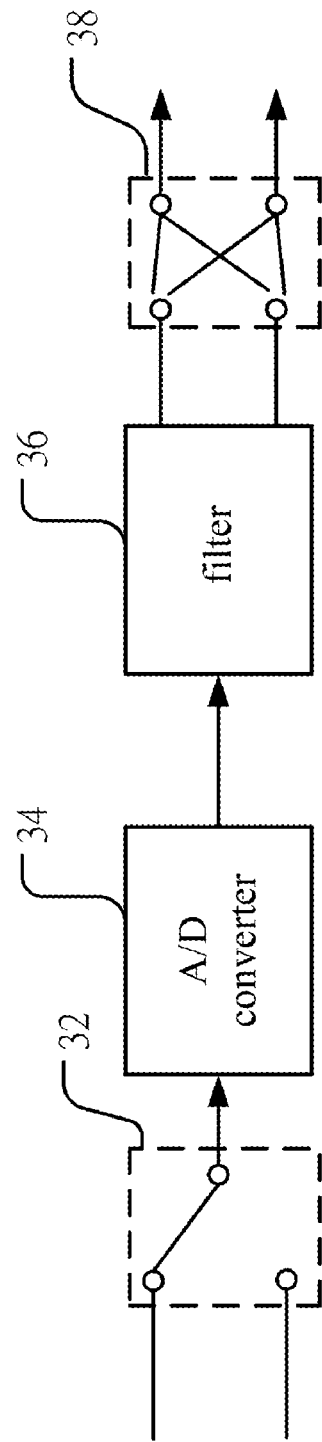
FIG. 4 shows a block diagram according to another preferred embodiment of the present invention.

FIG. 4 shows a block diagram according to another preferred embodiment of the present invention. As shown in the figure, the difference between the apparatus for frequency conversion 30 according to the present preferred embodiment and the one according to the preferred embodiment in FIG. 2 is that, according to the present preferred embodiment, the apparatus for frequency conversion 30 is applied to receiving baseband signals and performing frequency conversion. The apparatus for frequency conversion 30 according to the present preferred embodiment comprises a switch 32, an A/D converter 34, a filter 36, and a switching module 38. The switch 32 switches between a first input path and a second input path according to a sampling frequency $f_s$ receives a first input signal or a second input signal corresponding to the first input path and the second input path, respectively, and transmits the first input signal and second input signal to the A/D converter 34. When the A/D converter 34 receives the first or second input signal, it samples the first or second input signal according to the sampling frequency $f_s$ and produces a first digital signal. There exists a correspondence between the sampling frequency and the frequency of the first or second input signals. Namely, the sampling frequency is one quarter of the frequency of the first or second input signals.

The filter 36 is coupled to the A/D converter 34 for receiving and filtering the first digital signal of the A/D converter 34, and producing a filter signal. The switching module 38 is coupled to the filter 36, and outputs the filter signal to an output path and a second output path alternately according to the sampling frequency $f_s$. The first and second output paths are an inphase (I) output path or a quadrature (Q) output path, respectively. The filter signal produced by the filter 36 includes a first filter signal and a second filter signal, which are output to the first and second output paths, respectively, via the switching module 38. The A/D converter 34, the filter 36, and the switching module 38 have been described in detail in the preferred embodiment of FIG. 2, and will not be described in more detail.

Similar to the preferred embodiment in FIG. 2, because the sampling frequency is one quarter of the frequency of the first or second input signal, the switch 32 switches the first and second input signals according to the sampling frequency, saving the use of an A/D converter and a filter. Thereby, the circuit complexity and area are reduced, and hence the cost is saved.

Figure 5:
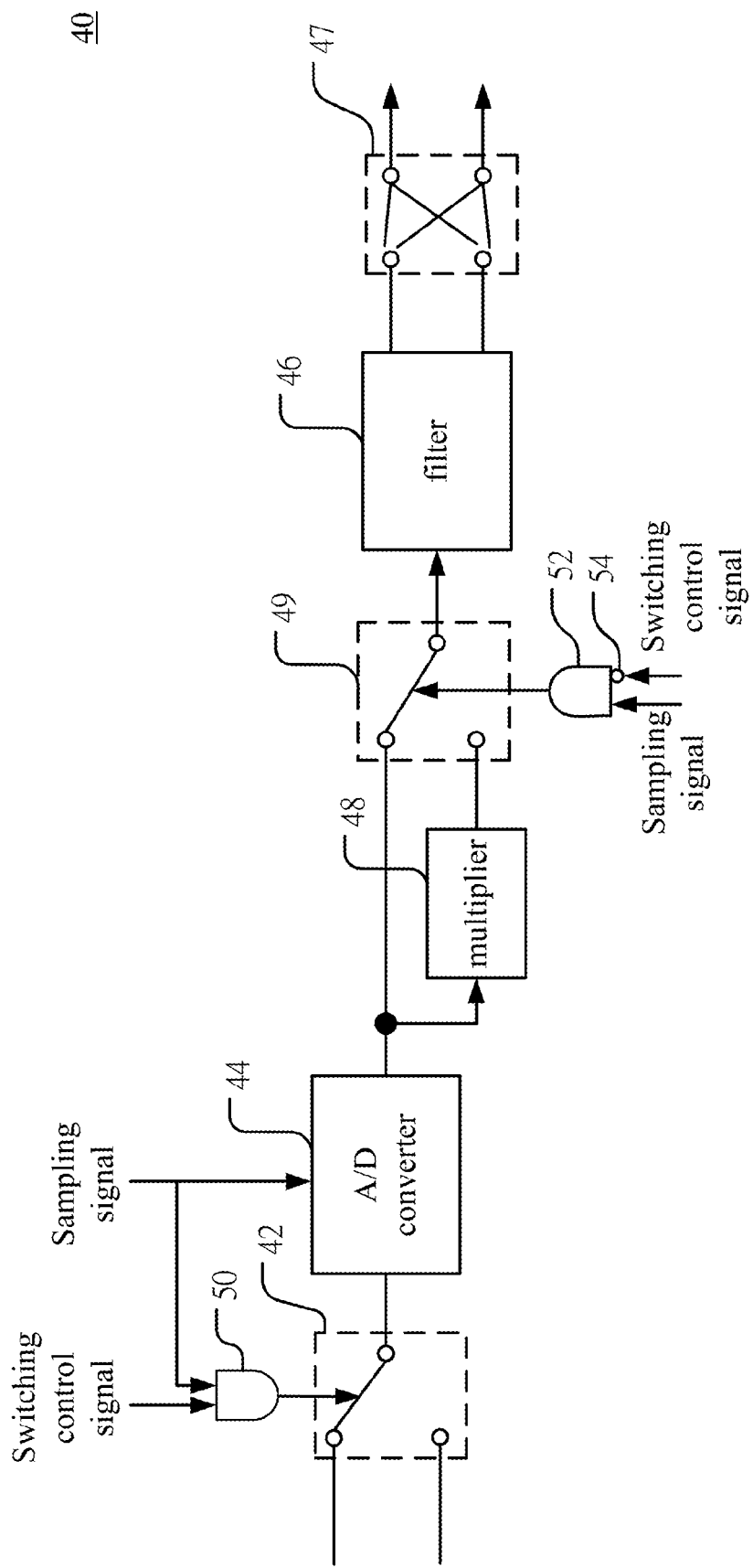
FIG. 5 shows a block diagram according to another preferred embodiment of the present invention.

FIG. 5 shows a block diagram according to another preferred embodiment of the present invention. As shown in the figure, the difference between the apparatus for frequency conversion 40 according to the present preferred embodiment and the one according to the preferred embodiments in FIG. 2 and FIG. 4 is that, according to the present preferred embodiment, the apparatus for frequency conversion 40 is applied to receiving both of the IF and baseband signals and performing frequency conversion. The apparatus for frequency conversion 40 according to the present preferred embodiment comprises a switch 42, an A/D converter 44, a filter 46, a switching module 47, a multiplier 48, a second switch 49, a first logic gate 50, a second logic gate 52, and an inverter 54.

Because the apparatus for frequency conversion 40 according to the present preferred embodiment, in comparison with the apparatus for frequency conversion 10, has the switching module, which includes the first and second logic gates 50, 52, for controlling the first and second switches 42, 49, it can be applied to converting IF signals or baseband signals. According to an embodiment, the first logic gate 50 can be an AND gate; the second logic gate 52 can be an AND gate having one or more inverted input terminals. The first logic gate 50 produces a switching signal according to a control signal for controlling the first switch 42. That is, when the level of the control signal received by the first logic gate 50 is high, it means that the apparatus for frequency conversion 40 is applied to baseband signals. The first logic gate 50 switches the first and second input signals sequentially according to the sampling frequency $f_s$ of the sampling signal for the A/D converter 44 to perform sampling and conversion. Meanwhile, the second switch 49 stops switching, but transmits the first digital signal produced by the A/D converter 44 to the filter 46 for filtering and outputting. When the level of the control signal is low, it represents that the apparatus for frequency conversion 40 is applied to IF signals. The first switch 42 stops switching, and hence the operation of the apparatus for frequency conversion 40 is identical to that of the apparatus for frequency conversion 10. Thereby, the A/D converter 44 receives a third input signal via the transmission channel of the first or second input signal described above, and produces a third digital signal for the sign conversion circuit 48 and the second switch 49. The third input signal (not shown in the figure) is an output signal of a tuner, and is an IF signal. The sign conversion circuit 48 inverts the sign of the third digital signal and produces a fourth digital signal. According to another embodiment, the sign conversion circuit 48 can be a multiplier, multiplying the third digital signal by a negative number, producing the fourth digital signal, and transmitting the fourth digital signal to the switch 49. According to a preferred embodiment, the negative number can be −1; according to a second preferred embodiment, the sign conversion circuit 14 can be a 1's complement circuit; according to a third preferred embodiment, the sign conversion circuit 14 can be a 2's complement circuit. In addition, the second switch 49 switches the third and fourth digital signals sequentially at a switching frequency according to one half of the sampling frequency ($f_s/2$), transmits to the filter 46 for filtering, and thus producing a third filter signal and a fourth filter signal, respectively.

To sum up, the sampling frequency $f_s$ of the A/D converter in the apparatus for frequency conversion according to the present invention complies with the following equation:

$$n * f_s \pm f_{IF} = f_s/4$$

That is, the sampling frequency $f_s$ of the A/D converter is four or eight times, etc. the frequency of the input signal. Thereby, the use of oscillators can be saved. By switching of the switches, the use of A/D converters and filters can be reduced as well, relatively reducing circuit area and cost. Besides, the apparatus for frequency conversion according to the present invention can be applied to both baseband signal and IF signals, further saving cost.

Accordingly, the present invention conforms to the legal requirements owing to its novelty, non-obviousness, and utility. However, the foregoing description is only a preferred embodiment of the present invention, not used to limit the scope and range of the present invention. Those equivalent changes or modifications made according to the shape, structure, feature, or spirit described in the claims of the present invention are included in the appended claims of the present invention.

The invention claimed is:

1. An apparatus for frequency conversion, comprising:
    an analog-to-digital (A/D) converter, receiving and sampling an input signal according to a sampling frequency for producing a first digital signal, and the sampling frequency and the frequency of the input signal having a correspondence;
    a sign conversion circuit, used for receiving the first digital signal, and performing a sign conversion on the first digital signal, thereby sign-converting the first digital signal into a second digital signal;
    a first switching module, used for selecting one of the first digital signal and the second digital signal as an output signal according to the sampling frequency;
    a filter, coupled to the first switching module, used for filtering the output signal from the first switching module, and producing a filter signal; and
    a second switching module, coupled to the filter, used for outputting the filter signal to a first output path or a second output path alternately according to the sampling frequency.

2. The apparatus for frequency conversion of claim 1, wherein the correspondence is that the sampling frequency is one quarter of the frequency of the input signal.

3. The apparatus for frequency conversion of claim 1, wherein the first switching module transmits the first digital signal and the second digital signal alternately according to one half of the sampling frequency.

4. The apparatus for frequency conversion of claim 1, wherein the sign conversion circuit includes a multiplier, used for multiplying the first digital signal by a negative number and producing the second digital signal.

5. The apparatus for frequency conversion of claim 1, wherein the filter comprises:
- a first delay module, used for receiving and delaying the input signal sequentially, and producing a plurality of first delay signals;
- a second delay module, used for receiving and delaying one of the plurality of first delay signals sequentially, and producing a plurality of second delay signals;
- a first adder module, used for receiving the input signal, the plurality of first delay signals, and the plurality of second delay signals, summing up the corresponding input signal, the plurality of first delay signals, and the plurality of second delay signals, respectively, and producing a plurality of first sum signals correspondingly;
- a first multiplier module, used for receiving the plurality of first sum signals and a plurality of first coefficients, multiplying the plurality of sum signals by the corresponding first coefficients in the plurality of first coefficients, respectively, and producing a plurality of first product signals correspondingly;
- a second multiplier module, used for receiving the plurality of first sum signals and a plurality of second coefficients, multiplying the plurality of sum signals by the corresponding second coefficients in the plurality of second coefficients, respectively, and producing a plurality of second product signals correspondingly;
- a second adder module, used for receiving and summing up the plurality of first product signal, respectively, and producing a first filter signal; and
- a third adder module, used for receiving and summing up the plurality of second product signal, respectively, and producing a second filter signal.

6. The apparatus for frequency conversion of claim 1, and further comprising:
- a third switching module, coupled to the A/D converter, switching between a first input path and a second input path according to the sampling frequency and a switching control signal for receiving the input signal, transmitting the received input signal from the first input path or the second input path to the A/D converter, and stopping switching according to the switching control signal but transmitting the received signal from the first input path only; and
- a switching control module, used for producing the switching control signal for the first switching module and the third switching module for controlling switching of the first switching module and the third switching module.

7. The apparatus for frequency conversion of claim 6, wherein when the third switching module is fixed to receiving the signal transmitted from the first input path, the first switching module transmits the first digital signal and the second digital signal to the filter alternately according to the sampling frequency.

8. The apparatus for frequency conversion of claim 6, wherein when the third switching module switches between the first input path and the second input path for receiving the input signal, the first switching module stops switching but transmits the first digital signal only.

9. A method for frequency conversion, comprising steps of:
- providing a first input path, receiving and sampling a first input signal from the first input path according to a first sampling frequency and producing a first digital signal, and the first sampling frequency and the frequency of the input signal having a correspondence;
- performing a sign conversion to the first digital signal, thereby sign-converting the first digital signal into a second digital signal;
- filtering one or more of the first digital signal and the second digital signal, and producing a first filter signal and a second filter signal; and
- outputting the first filter signal and the second filter signal to a first output path and a second output path, respectively.

10. The method for frequency conversion of claim 9, wherein the correspondence is that the first sampling frequency is one quarter of the frequency of the first input signal.

11. The method for frequency conversion of claim 9, wherein the step of producing the first filter signal and the second filter signal further comprises switching between the first digital signal and the second digital signal according to a second sampling frequency, and filtering the first digital signal and the second digital signal alternately.

12. The method for frequency conversion of claim 11, wherein the second sampling frequency is one half of the first sampling frequency.

13. The method for frequency conversion of claim 9, wherein the step of providing a first input path, receiving and sampling a first input signal from the first input path according to a first sampling frequency and producing a first digital signal further comprises providing a second input path, switching between the first input path and the second input path according to the first sampling frequency and a switching control signal, and transmitting the first input signal and a second input signal from the second input path alternately and producing the first digital signal.

14. The method for frequency conversion of claim 13, wherein the step of producing the first filter signal and the second filter signal further comprises filtering the first digital signal and producing the first filter signal and the second filter signal.

* * * * *